(12) United States Patent
Colin et al.

(10) Patent No.: US 11,538,718 B2
(45) Date of Patent: Dec. 27, 2022

(54) METHOD OF PRODUCING SEMICONDUCTOR DEVICES IN A SUBSTRATE INCLUDING ETCHING OF THE PATTERN OF AN ETCH MASK AND/OR A RETICLE TO CREATE THE FIRST DICING LANES ENCIRCLING THE DEVICES AND SECOND DICING LANES DEFINED BY FRACTURE LINES OF THE EDGES OF THE SUBSTRATE

(71) Applicants: COMMISSARIAT À L'ÉNERGIE ATOMIQUE ET AUX ÉNERGIES ALTERNATIVES, Paris (FR); SAFRAN, Paris (FR)

(72) Inventors: Mikaël Colin, Grenoble (FR); Audrey Berthelot, Saint-Ismier (FR)

(73) Assignees: COMMISSARIAT A L'ENERGIE ATOMIQUE ET AUX ENERGIES ALTERNATIVES, Paris (FR); SAFRAN, Paris (FR)

( * ) Notice: Subject to any disclaimer, the term of this patent is extended or adjusted under 35 U.S.C. 154(b) by 214 days.

(21) Appl. No.: 16/956,278

(22) PCT Filed: Dec. 17, 2018

(86) PCT No.: PCT/FR2018/053318
§ 371 (c)(1),
(2) Date: Jun. 19, 2020

(87) PCT Pub. No.: WO2019/122641
PCT Pub. Date: Jun. 27, 2019

(65) Prior Publication Data
US 2021/0082762 A1 Mar. 18, 2021

(30) Foreign Application Priority Data
Dec. 22, 2017 (FR) ...................... 1763160

(51) Int. Cl.
*H01L 21/78* (2006.01)
*B23K 26/53* (2014.01)
(Continued)

(52) U.S. Cl.
CPC .............. *H01L 21/78* (2013.01); *B23K 26/53* (2015.10); *H01L 21/0275* (2013.01); *B23K 2101/40* (2018.08)

(58) Field of Classification Search
CPC .............. H01L 21/268; H01L 21/0274; H01L 21/30604; H01L 21/30608; B81C 1/00865; B81C 1/00904
See application file for complete search history.

(56) References Cited

U.S. PATENT DOCUMENTS

2012/0261678 A1* 10/2012 Hiraiwa .................. B23K 26/40
257/E33.056
2016/0379884 A1* 12/2016 Ortner .................. H01L 21/3083
430/5

(Continued)

OTHER PUBLICATIONS

U.S. Appl. No. 16/348,004 entitled "Hinged Microelectromechanical And/Or Nanoelectromechanical Device Wiht Out-Of-Plane Movement", filed Sep. 11, 2017.
U.S. Appl. No. 16/492,345 entitled "Microdevice Comprising At Least Two Movable Elements", filed Sep. 9, 2019.
International Search Report for PCT/FR2018/053318 dated Feb. 21, 2019.

(Continued)

*Primary Examiner* — Ermias T Woldegeorgis
(74) *Attorney, Agent, or Firm* — Pearne & Gordon LLP

(57) ABSTRACT

Process for producing semiconductor devices in a substrate, comprising: photolithography of a pattern of a reticle onto a portion of the substrate, defining first elements of the semiconductor devices, an exposure of the pattern being repeated a plurality of times in order to define all of the devices, photolithography of a pattern of an etch mask over all of the substrate, etching photolithography patterns into one portion of the thickness of the substrate, wherein first dicing lanes encircling the devices are included in the pattern of the etch (Continued)

mask and/or of the reticle, and the photolithography of the etch mask defines second dicing lanes defined by predetermined fracture lines of the edges of the substrate, and furthermore comprising the implementation of a step of irradiating the substrate with a laser beam through the first and second dicing lanes.

16 Claims, 4 Drawing Sheets

(51) Int. Cl.
      *H01L 21/027*     (2006.01)
      *B23K 101/40*     (2006.01)

(56) References Cited

U.S. PATENT DOCUMENTS

2019/0011260 A1    1/2019   Onfroy et al.
2019/0198396 A1*  6/2019   Saeki .................. H01L 21/3043

OTHER PUBLICATIONS

Written Opinion for PCT/FR2018/053318 dated Feb. 21, 2019.
Search Report for French application No. FR1763160 dated Oct. 10, 2018.
Wikipedia: "Stepper" Dec. 15, 2017.
Kumagai M, et al. "Advanced Dicing Technology for Semiconductor Wafer-Stealth Dicing" In: IEEE Transactions on Semiconductor Manufacturing, Aug. 1, 2001, vol. 20, No. 3, pp. 259-265.

* cited by examiner

METHOD OF PRODUCING SEMICONDUCTOR DEVICES IN A SUBSTRATE INCLUDING ETCHING OF THE PATTERN OF AN ETCH MASK AND/OR A RETICLE TO CREATE THE FIRST DICING LANES ENCIRCLING THE DEVICES AND SECOND DICING LANES DEFINED BY FRACTURE LINES OF THE EDGES OF THE SUBSTRATE

CROSS-REFERENCE TO RELATED APPLICATIONS

This is a National Stage application of PCT international application PCT/FR2018/053318, filed on Dec. 17, 2018, which claims the priority of French Patent Application No. 1763160, filed Dec. 22, 2017, both of which are incorporated herein by reference in their entirety.

TECHNICAL FIELD AND PRIOR ART

The invention concerns the field of batch production of semiconductor devices, or chips, in particular MEMS (microelectromechanical systems) and/or NEMS (nanoelectromechanical systems) devices on, for example, bulk or semiconductor on insulator, such as SOI (Silicon On Insulator) or BSOI (Bonded Silicon On Insulator), substrates or wafers.

The substrates generally have standardised dimensions (4", 8", 12", etc.) and a thickness of a few hundred micrometres. One of the main steps undergone by the substrates during the production of semiconductor devices in these substrates, after the steps of batch manufacturing of the devices in a clean room (deposition, etching, doping, etc.) consists of dicing them in such a way as to separate the devices from each other and thus obtaining independent chips. In general, the devices obtained after this dicing have micrometre, millimetre or even centimetre scale external dimensions.

Various techniques exist for performing this substrate dicing.

A first of these techniques consists of sawing the substrate with a circular diamond saw. This dicing technique has many advantages. It is relatively quick (a single pass of the saw per dicing line) and enables dicing lines to be produced even if the height of the substrate varies along the dicing lane or if there are metallised regions on this lane. In particular, it also enables dicing of a substrate along its entire length during a single pass of the saw, by simultaneously passing through the regions where the devices are produced and through the edges of the substrate on which no device is produced.

However, this type of saw dicing requires a means for cooling and for removal of the dicing-generated residues. These needs are traditionally met by high-pressure water jets, making this dicing technique inappropriate for dicing substrates on which the devices are not protected, for example by WLP capping (Wafer Level Packaging), due to the risks of breaking and/or "sticking" (sticking of the mobile elements of the devices) caused by these high-pressure water jets. Finally, saw dicing of substrates only enables straight-line dicing lines passing all the way through the substrate.

Another dicing technique consists of laser dicing of the substrate by ablation. The use of a laser can overcome some of the inherent disadvantages of saw dicing. Firstly, it enables dicing patterns other than straight-line patterns to be produced.

Moreover, it does not require any cooling means. There is however a risk of contamination of the diced substrate due to redeposition, on the diced substrate, of particles generated by the laser dicing. This technique is therefore also not suitable for dicing substrates comprising unprotected mobile devices.

There is also a special laser dicing technique, called "stealth dicing" or laser dicing by silicon amorphization, which can remove the risk of contamination by redeposition of particles that is characteristic of laser dicing by ablation. The substrate to be diced, on which the devices have been produced by implementing steps of deposition, photolithography, etching, etc., is placed on a stretch film. Then, a laser beam is used to locally modify, at the focal point of the beam, the crystalline structure of the semiconductor of the substrate to be diced. Since the illuminated semiconductor becomes locally amorphous in a crystalline environment, a stress concentration appears at this location and relaxes by microcracking. Along a dicing lane, several passes of the laser beam, at different depths of the substrate, enable lines of weakness, or cracking lines, to form through the entire thickness of the substrate. After having produced all the desired lines of weakness in the substrate, the stretch film on which the substrate is deposited is isotropically stretched, which also stretches the substrate. This stretching creates spaces of a few tens of microns at the lines of weakness between the devices such that they can then be collected. This stretching makes it possible to complete the laser dicing at locations where this dicing is incomplete, if necessary, by cleaving.

For an SOI (Silicon On Insulator) substrate comprising MEMS and/or NEMS devices, the elements of which, in particular the mobile elements, are produced in the silicon active layer, or surface layer, of the substrate, the dicing lanes can be etched in the active layer at the same time as the elements of the devices by including these dicing lanes in the pattern of the etch mask used to form the elements of the devices. This forms, through the semiconductor active layer, accesses that are usable by the laser beam in order to more easily reach the support layer, or grip layer, of the substrate and to modify its crystalline structure along the dicing lanes.

Given that the critical dimensions (minimum dimensions of the elements constituting them) of the devices, in particular MEMS and/or NEMS (of micrometre or nanometre order respectively) are generally less than the limiting dimensions attainable by the etch masks, a photolithography system called a "stepper", or step-by-step photolithography system, is generally used for the UV exposure step of the photosensitive resin, prior to etching, during the production of the elements of the devices. In contrast to conventional exposure systems with which the entire surface of the substrate is exposed simultaneously using a single etch mask, or photomask, covering, either directly or in the near field, the entire surface of the substrate, exposure by a "stepper" device uses a special etch mask, called a reticle, which comprises an elementary pattern corresponding to the elements of one or more devices and to the dicing lanes of this or these devices. The exposure of this reticle is repeated a plurality of times over the surface of the substrate, at different locations on the substrate. Conventionally, a reticle comprises the patterns of a few devices to a few thousand devices. The production of patterns up to the edges of the substrate using such a system is to be avoided, because a device produced astride the edge of the substrate cannot be incorporated and risks generating a contamination due to the possible production of unanchored mobile parts. Hence, a step-by-step photolithography must be carried out in a non-overflowing field, the edges of the substrate not being exposed by this photolithography step. The dicing lanes produced in the active layer cannot therefore be produced up to the edges of the substrate.

This precaution of not producing a device comprising elements suspended at the edges of the substrate is also valid for a photolithography of the entire surface of the substrate carried out using a single etch mask covering the entire surface of the substrate.

The fact that it is not possible to produce dicing lanes up to the edges of the substrate is not a problem when the semiconductor of the substrate is not both thick and strongly doped. For example, for semiconductor devices produced in an SOI substrate comprising a stack formed of an active layer, or surface layer, of doped silicon of thickness equal to approximately 60 µm, a buried dielectric (BOX) of $SiO_2$ of thickness equal to approximately 2 µm and a silicon support layer of thickness equal to approximately 725 µm, the dicing lanes are produced by DRIE (Deep Reactive Ion Etching) around the devices, and the lines of weakness are then produced by laser irradiation in the support layer through these dicing lanes. At the edges of the substrate, only the lines of weakness are formed, without a dicing lane. Given the low thickness of the silicon active layer, a sufficient energy of the laser beam reaches the support layer, which makes it possible, at the edges of the substrate, to produce lines of weakness in the support layer and in the active layer. In this case, the separation of the devices obtained is good and conforms to the dicing lanes and the lines of weakness produced.

By contrast, the fact that it is not possible to produce the dicing lanes up to the edges of the substrate becomes problematic for dicing strongly doped or thick semiconductor, such as, for example, when the elements of the devices are produced within two active layers of doped semiconductor that are superimposed and disposed above the support layer of the substrate, or even within a thick single active layer. Indeed, the rate of transmission of the laser beam drops rapidly with the doping level and total thickness of the doped semiconductor to be passed through. By way of example, the transmission rate of a laser beam through a 60 µm thickness of P (or boron) doped silicon at approximately $5 \cdot 10^{18}$ at/cm$^3$ is approximately 70%. This transmission rate is only 40% when the thickness of this same semiconductor is 120 µm. Such a thickness may correspond to the total thickness of the two active layers in which the elements of the devices are produced. For example, for devices produced in an SOI substrate comprising a stack formed of a first active layer of doped silicon of thickness equal to approximately 60 µm in which a portion of the elements of the devices are produced, a first $SiO_2$ buried dielectric of thickness equal to approximately 2 µm, a second active layer of doped silicon of thickness equal to approximately 60 µm in which the rest of the elements of the devices are produced, a second $SiO_2$ buried dielectric of thickness equal to approximately 2 µm and a silicon support layer of thickness equal to approximately 725 µm, the lines of weakness produced at the edges of the substrate cannot be formed through the entire thickness of the support layer because of the absence of dicing lanes at the edges of the substrate and because of the thickness of semiconductor of the active layers to be passed through by the laser beam in order to reach the support layer. In this case, the separation of the devices obtained after having stretched the stretch film on which the substrate is located is good and conforms to the dicing lanes in the portions of the substrates at which the dicing lanes are produced, but not at the edges of the substrates where the lines of weakness form in an uncontrolled manner during the expansion phase of the stretch film. These uncontrolled fracture lines are undesirable to the extent where they induce a serious risk of failure of the devices (breaking, sticking of elements, etc.) when they occur, because these fractures are comparable to a violent shock suffered by the devices.

DISCLOSURE OF THE INVENTION

One aim of the present invention is to propose a method for producing semiconductor devices which does not have the disadvantages of the described methods of the prior art, in other words in which a separation of the devices by "stealth dicing" can be implemented whatever the doping and thickness of the layer or layers of the substrate in which the devices are produced, and this without forming uncontrolled fracture lines at the edges of the substrate during separation of the devices.

To do this, the present invention proposes a method for producing semiconductor devices in a substrate, comprising at least the implementation of the following steps:

photolithography of a pattern of a reticle over a portion of a main face of the substrate, defining at least first elements of at least one of the semiconductor devices in the substrate, an exposure of the pattern of the reticle being repeated a plurality of times over the main face of the substrate in order to define the first elements of all the semiconductor devices, photolithography of a pattern of an etch mask over all of the main face of the substrate, etching of the photolithography patterns over the main face of the substrate into a portion of the thickness of the substrate, wherein first dicing lanes encircling the semiconductor devices are included in the pattern of the etch mask and/or in the pattern of the reticle, and the step of photolithography of the pattern of the etch mask over all of the main face of the substrate defines second dicing lanes defined by predetermined fracture lines of the edges of the substrate, and further comprising the implementation of a step of irradiating the substrate with a laser beam through the first and second dicing lanes, forming lines of weakness in the substrate, or fracture lines, under the first and second dicing lanes.

This method proposes using two existing photolithography techniques in order to produce all the dicing lanes necessary for a good separation of the semiconductor devices without risking damaging them.

The photolithography of the reticle pattern making it possible to define the first elements of the semiconductor devices is thus implemented using a step-by-step or "stepper" photolithography system, which makes this method compatible with the production of elements of semiconductor devices having very small dimensions.

The other photolithography carried out with the etch mask in contact or in the near field with the substrate, and which is implemented with a single exposure step over the entire surface of the substrate, enables the production of second dicing lanes at the edges of the substrate. Thus, the lines of weakness then formed by laser irradiation of the substrate are produced under the first dicing lanes but also under the second dicing lanes. During the separation of the semiconductor devices, the fracture lines therefore form in a controlled manner following the produced lines of weakness. This control of the fracture lines obtained at the separation of the semiconductor devices is also allowed by the fact that the second dicing lanes and the lines of weakness formed under the second dicing lanes are defined as a function of the predetermined fracture lines of the edges of the substrate, in other words the lines where the substrate fractures in the absence of lines of weakness during a separation of the semiconductor devices.

Thus, the risk of uncontrolled fracture of the substrate during separation of the semiconductor devices is removed, even when the substrate is thick and has a high-level of doping.

This method does not present the disadvantages encountered with the saw dicing or laser ablation dicing methods, and is therefore compatible with the production of devices that do not have a cap.

In the method described above, the photolithography step using a reticle defining the first elements of the semiconductor devices may be implemented before or after the photolithography step using the etch mask defining the second dicing lanes.

The method may further comprise, before implementing the photolithography steps, a step of identifying the predetermined fracture lines of the edges of the substrate by modelling or by analytic calculation or by observation of fracture lines obtained in another substrate identical to said substrate and in which the second dicing lanes have not been produced.

The second dicing lanes may be located at least on the predetermined fracture lines of the edges of the substrate. In this case, during the separation of the semiconductor devices, the fracture lines form in a controlled manner at the edges of the substrate and correspond at least to the predetermined fracture lines of the edges of the substrate.

It is also possible that the second dicing lanes are not located exactly along the predetermined fracture lines of the edges of the substrate, but close to the predetermined fracture lines of the edges of the substrate, in directions substantially close to the predetermined fracture lines of the edges of the substrate, which makes it possible to guide the fracture lines along the second dicing lanes.

The predetermined fracture lines of the edges of the substrate extend from the corners formed by the first dicing lanes to the edges of the substrate. This configuration corresponds to the predetermined fracture lines obtained when the substrate is isotropically stretched during the separation of the devices produced on this substrate.

The semiconductor devices may be MEMS and/or NEMS semiconductor devices. In this case, the elements of the semiconductor devices correspond to the fixed and/or mobile elements of the devices.

According to a first embodiment, the method may be such that:
  the substrate comprises a support layer, a first active semiconductor layer, and a first dielectric layer disposed between the support layer and the first active layer,
  the first elements of the semiconductor devices and the first and second dicing lanes are etched in the first active layer, and
  the lines of weakness are formed in the support layer.

In this first embodiment, the substrate corresponds to a semiconductor-on-insulator substrate, for example an SOI substrate. In addition, in this first embodiment, the main face of the substrate on which the photolithography steps are implemented corresponds the main face of the first active layer opposite the face in contact with the first dielectric layer. During the production of such semiconductor devices, it is possible that other steps, for example photolithography and etching and/or deposition of material, are implemented on the rear face of the substrate, in other words the other main face of the substrate which corresponds to the main face of the support layer opposite to the face in contact with the first dielectric layer.

The thickness of the first active layer may be greater than or equal to approximately 120 μm.

According to a second embodiment, the method may be such that:
  the substrate comprises a support layer, a first active semiconductor layer, a first dielectric layer disposed between the support layer and the first active layer, a second dielectric layer such that the first active layer is disposed between the first and second dielectric layers, and a second active semiconductor layer such that the second dielectric layer is disposed between the first and second active layers,
  the first elements of the semiconductor devices and the first and second dicing lanes are etched at least into the second active layer, and
  the lines of weakness are formed in the support layer and in the first active layer.

In this second embodiment, the substrate comprises two active layers which can serve to produce the elements of the semiconductor devices. The substrate may be an SOI substrate onto which the second active layer and the second dielectric layer have been transferred. The combined use of the first and second dicing lanes and the laser irradiation with such a substrate, makes it possible to overcome the constraints linked to the doping and total thickness of the active layers.

In this second embodiment, the method may further comprise, before implementing the photolithography steps, the implementation of the following steps:
  producing, from a stack comprising the support layer, the first dielectric layer and the first active layer, second elements of the semiconductor devices in the first active layer by photolithography and etching,
  transferring and securing the second dielectric layer and the second active layer against a first active layer.

The total thickness of the first and second active layers may be greater than or equal to approximately 120 μm.

According to an advantageous embodiment, the pattern of the etch mask may include a separate identifier for each of the semiconductor devices.

The pattern of the etch mask may include a portion of the patterns of the semiconductor devices. For example, this portion of the patterns of the semiconductor devices may correspond to at least one element not requiring a significant resolution or a very precise positioning (for example, not requiring a precision of less than 1 or 2 microns) compared to the remainder of the pattern of semiconductor devices defined by the reticle. Such an element may correspond, for example, to an opening to a lower level, serving, for example, for producing a contact socket.

The method may be such that:
  between the steps of etching the photolithography patterns and the step of irradiating the substrate by laser beam, the substrate is disposed on a stretch film, and
  after implementing the step of irradiating the substrate, the stretch film is stretched so that the semiconductor devices are separated from each other at the first dicing lanes and so that different portions of the substrate forming the edges of the substrate are separated from each other at the second dicing lanes.

Advantageously, the stretch film may be stretched isotropically.

The stretch film may comprise a polymer and have adhesive properties and, after stretching of the stretch film, the stretch film may be exposed to UV radiation from a face opposite that on which the semiconductor devices are located, in order to remove the adhesive properties of the stretch film.

The first dicing lanes may form frames of substantially rectangular shape around the semiconductor devices.

The semiconductor material of the substrate is advantageously silicon. However, the method may be implemented for other semiconductor materials such as SiGe, Ge, and AsGa, etc.

BRIEF DESCRIPTION OF THE FIGURES

The present invention will be better understood on reading the description of the embodiments, given purely by way of indication and in no way limiting, by making reference to the attached drawings, in which.

Identical, similar or equivalent parts of the various figures described below are given the same reference numbers in order to facilitate the passage from one figure to another.

The various parts shown in the figures are not necessarily on a uniform scale, in order to make the figures more readable.

The various possibilities (variants and embodiments) should be understood as not being exclusive from each other and can be combined together.

DETAILED DISCLOSURE OF THE SPECIAL EMBODIMENTS

A method for producing semiconductor devices 100 in a substrate 102 according to a particular embodiment is described below in connection with FIGS. 1 to 9. In this particular embodiment, the semiconductor devices 100 produced are MEMS and/or NEMS devices.

Figure 1:
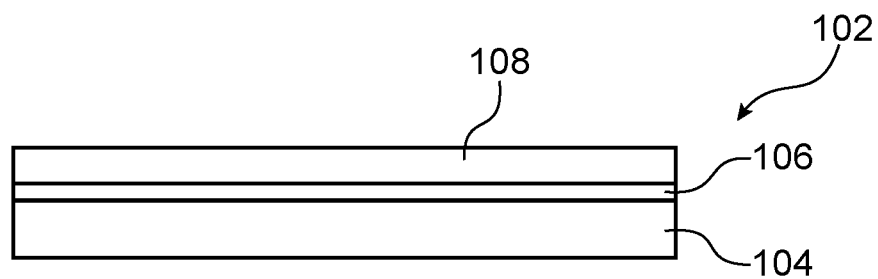
FIGS. 1 to 9 illustrate a method for producing semiconductor devices, subject matter of the present invention, according to a particular embodiment.

As shown in FIG. 1, the substrate 102 from which the semiconductor devices 100 are produced, in the form of chips, includes a support layer 104. The support layer 104 includes, for example, at least one semiconductor, in this case silicon, and has a thickness equal to a few hundred microns, for example greater than or equal to approximately 500 μm.

The substrate 102 also comprises a first dielectric, or insulating, layer 106 disposed on the support layer 104. The thickness of the first dielectric layer 106 is, for example, between approximately 0.1 μm and 5 μm, in this case equal to approximately 2 μm, and comprises for example $SiO_2$.

The substrate 102 also comprises a first semiconductor active layer 108 disposed on the first dielectric layer 106 and in which a portion of the mobile and/or fixed elements of the devices 100 is intended to be produced. The first active layer 108 comprises, for example, silicon and has a thickness which is between approximately 5 μm and 200 μm. In the particular embodiment described here, the first active layer 108 has a thickness equal to approximately 60 μm. Moreover, the semiconductor of the first active layer 108 is doped in this case, for example, with boron or phosphorus atoms and with a concentration, for example, between approximately $10^{13}$ at/$cm^3$ and $10^{20}$ at/$cm^3$, in this case approximately $5 \cdot 10^{18}$ at/$cm^3$.

Figure 2:
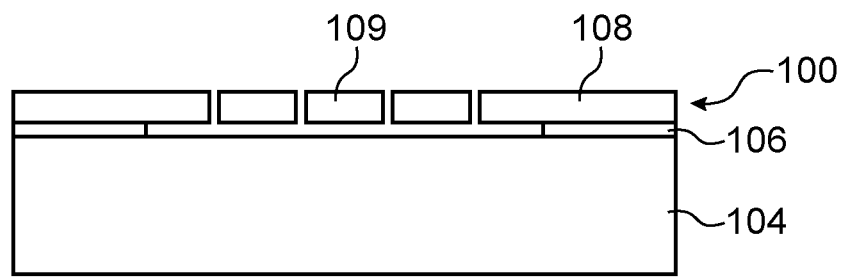
Figure 3:
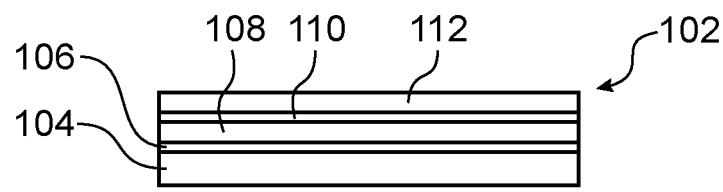

Mobile and/or fixed elements 109 of the devices 100 are produced in the first active layer 108 by implementing photolithography and etching steps. FIG. 2 shows schematically the structure obtained for one of the devices 100 at the end of these steps. Portions of the first dielectric layer 106 located under some of the elements 109, corresponding to the mobile elements, are etched in order to release these elements 109.

A second dielectric, or insulating, layer 110 and a second active layer 112 are then transferred and secured on the first active layer 108. This transfer can be carried out from another SOI substrate comprising a support layer, a buried dielectric layer and a surface layer of semiconductor. The surface layer of this other SOI substrate, intended to form the second active layer 112, is partially oxidised, forming the second dielectric layer 110 on the surface of this surface layer. A bonding is then produced between the second dielectric layer 110 and the first active layer 108. The support layer and the buried dielectric layer of this other SOI substrate are then successively removed in order to arrive at the stack illustrated in FIG. 3. In a variant, instead of using another SOI substrate, it is possible to use a bulk substrate forming the second active layer 112, oxidised beforehand, this oxidised portion forming the second dielectric layer 110. A bonding is then produced between the second dielectric layer 110 and the first active layer 108, forming the stack illustrated in FIG. 3. If necessary, the thickness of the second active layer 112 can be reduced by grinding and/or polishing.

The thickness of the second dielectric layer 110 is, for example, between approximately 0.1 μm and 5 μm, in this case equal to approximately 2 μm, and comprises for example $SiO_2$. The thickness and the material of the second dielectric layer 110 may be similar to the thickness and the material of the first dielectric layer 106.

The second active layer 112 comprises, for example, silicon and has a thickness which is between approximately 5 μm and 200 μm. In the particular embodiment described here, the first active layer 108 has a thickness equal to approximately 60 μm. As with the first active layer 108, the semiconductor of the second active layer 112 is doped in this case, for example, with boron or phosphorus atoms and with a concentration for example, between approximately $10^{13}$ at/$cm^3$ and $10^{20}$ at/$cm^3$, in this case approximately $5 \cdot 10^{18}$ at/$cm^3$.

Figure 4:
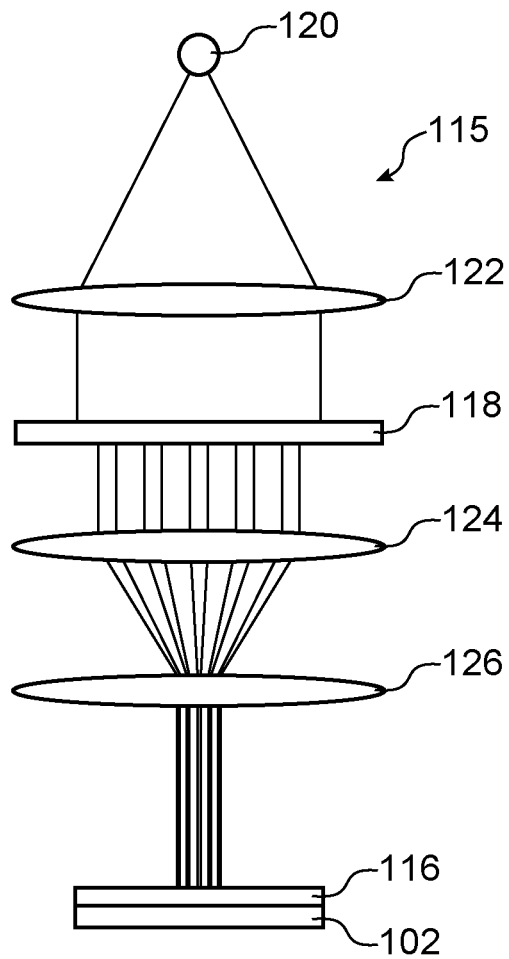

A first photolithography step is implemented in the second active layer 112 using a photolithography step-by-step or "stepper" photolithography system. FIG. 4 schematically shows the operating principle of such a stepper photolithography system 115. During this first photolithography step, a photosensitive resin 116 is deposited on the substrate 102, more precisely on the main face of the substrate 102 which corresponds to the front face of the substrate 102 and which is formed by the second active layer 112 (or by the first active layer 108 when the substrate 102 only comprises a single active layer). The pattern of a reticle 118 is then transferred into a portion of the resin layer 116 located on a portion of the second active layer 112 (or of the first active layer 108 when the substrate 102 only comprises a single active layer). This pattern can define elements 111 of other devices 100 (visible in FIG. 9). The transfer of the pattern of the reticle 118 into the resin layer 116 is obtained via a light source 120 emitting light which is then collimated on the reticle 118 by a first optical element 122. The rays of light passing through the reticle 118 are then reduced by a second optical element 124 then collimated by a third optical element 126 onto the portion of the second active layer 112 in which the elements defined by the reticle 118 are to be produced. Each of the first, second and third optical elements 122, 124, 126 is, for example, formed by one or more lenses.

In the particular embodiment described here, the photosensitive resin used is a positive resin, in other words a resin for which the part exposed to the light corresponds to that which will be subsequently removed during development of the resin. In a variant, the use of a negative resin is possible.

The use of a stepper type system for carrying out this first photolithography step makes it possible to define the various mobile and/or fixed elements of the devices 100 with relatively small dimensions, for example on the order of a micron or a few microns.

This transfer of the reticle pattern 118 into the resin layer 116 is repeated a plurality of times over the main face of the substrate 102 in order to define the elements of all the devices 100, for example by moving the substrate 102 with respect to the elements of the system 115 enabling focusing of the light rays at the desired location on the substrate 102.

In the particular embodiment described here, the pattern of the reticle 118 also includes first dicing lanes 130 surrounding the or each device 100, the elements of which are defined by the pattern of the reticle 118. Each of the patterns corresponding to one of the devices 100 is surrounded here by a first dicing lane 130, which then allows subsequent separating of the devices 100 from each other. The first dicing lanes 130 have a width much greater than that of the lines defining the mobile and/or fixed elements of the devices 100, for example equal to approximately 300 μm.

Figure 5:
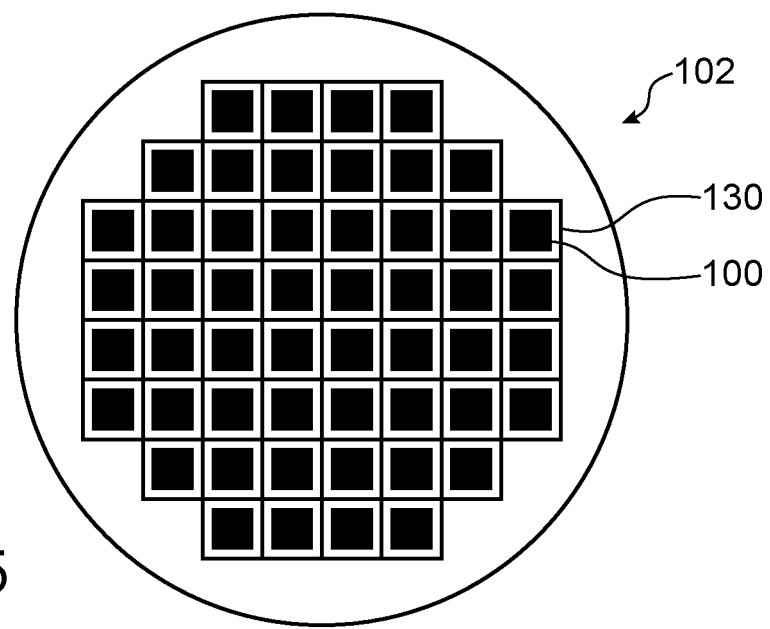

FIG. 5 shows a view from above of the main face of the substrate 102 in which the elements of the devices 100, each represented in the form of a rectangle, and the first dicing lanes 130 surrounding the devices 100 have been exposed in the resin layer 116 at this stage of the method. In this embodiment, the first dicing lanes 130 form frames of substantially rectangular shape around the devices 100.

Figure 6:
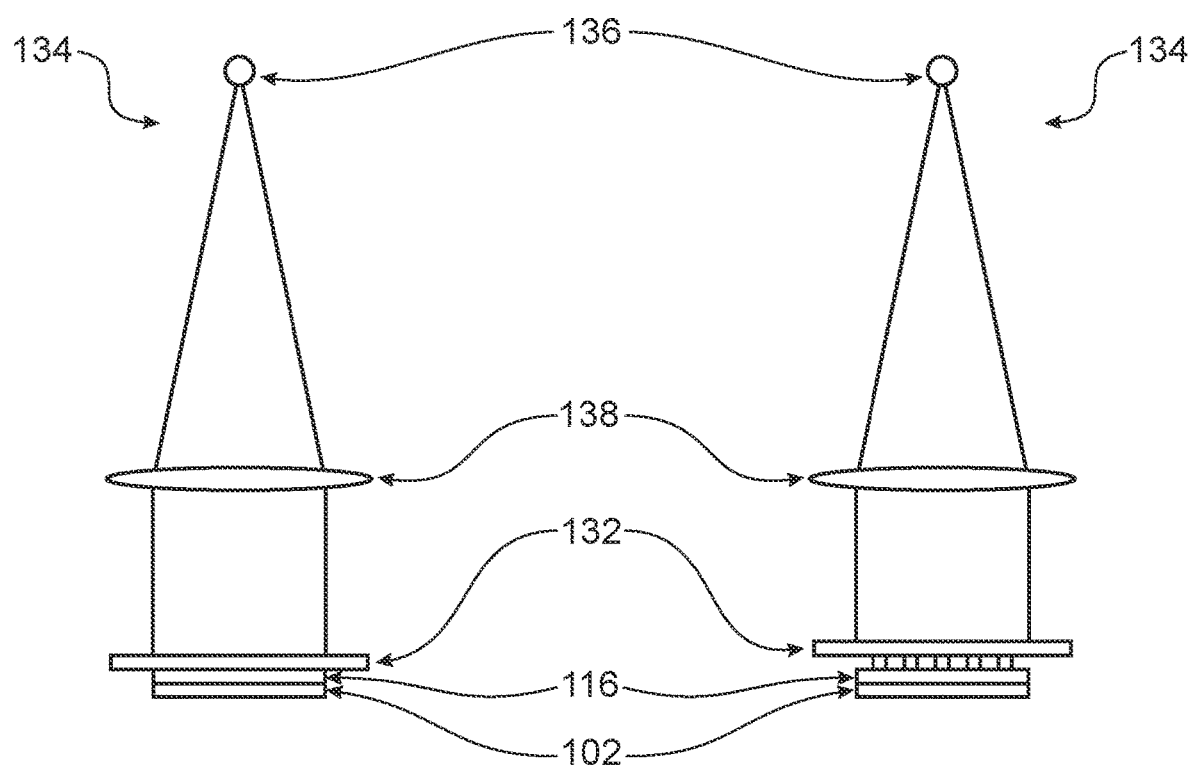

A second photolithography step is then implemented using a conventional photolithography system, in other words one in which an etch mask 132, or photomask, is disposed in contact with or in the near field of the resin layer 116 and such that its pattern enables exposing of all of the main face of the second active layer 112. FIG. 6 schematically illustrates such a system, reference sign 134, having the configuration in the left-hand side diagram in which the etch mask 132 is disposed in contact with the resin layer 116, and having the configuration in the right-hand diagram in which the etch mask 132 is disposed in the near field of the resin layer 116, in other words spaced apart from the resin layer 116. The transfer of the pattern of the etch mask 132 into the resin layer 116 is obtained by means of a light source 136 emitting light which is then collimated on the etch mask 132 by an optical element 138 formed, for example, of one or more lenses.

The pattern of the etch mask 132 corresponds to the second dicing lanes 140 located on the predetermined fracture lines of the edges of the substrate 102. These fracture lines correspond to the locations where the substrate 102 is intended to fracture during separation of the devices 100 from each other. These fracture lines are qualified as predetermined because their properties (number, location, etc.) are known in advance. They can be predetermined, for example, by having identified them beforehand by modelling or by analytic calculation, or even by having observed the fracture lines obtained naturally in another substrate identical to the substrate 102, in other words by having separated in the same manner the devices 100 produced on this other substrate, but without having produced the second dicing lanes 140 in the substrate.

In the embodiment described here, the devices 100 are intended to be separated from each other through the use of a stretch film 114 (visible in FIG. 8), on which the substrate 102 is stuck, by producing an isotropic stretching of this film 114. In this case, the predetermined fracture lines extend from the corners formed by the first dicing lanes 130 to the edges of the substrate 102. In a variant, it is however possible that this stretching is not isotropic, or again that the devices 100 are separated from each other by a different stretching step.

The second dicing lanes 140 have a width close or equal to that of the first dicing lanes 130, for example equal to approximately 300 μm in the embodiment described here.

In the embodiment described here, the number of second dicing lanes 140 is limited to the number of fracture lines which would appear naturally in the absence of the second dicing lanes during the isotropic stretching of the substrate 102. This makes it possible to avoid the production of unnecessary dicing lanes which could weaken the substrate 102, from the production of these dicing lanes until the separation of the devices 100.

In a variant, it is possible to produce additional second dicing lanes 140 which are not located on the predetermined fracture lines. In this case, during the separation of the devices 100, the edges of the substrate 102 separate into a plurality of portions by following the second dicing lanes 140 located on the predetermined fracture lines, as well as the additional second dicing lanes 140 which are not located on the predetermined fracture lines.

Figure 7:
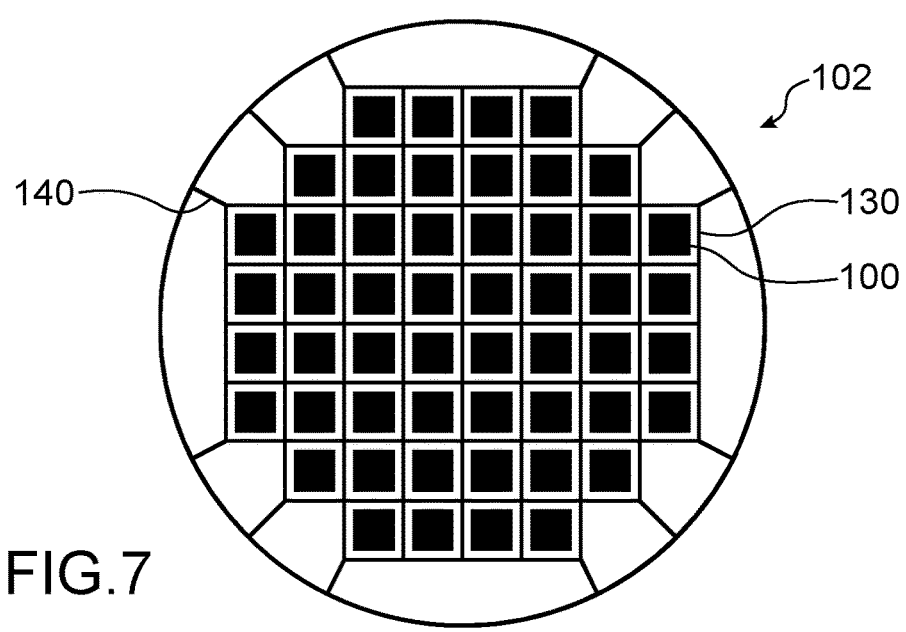

FIG. 7 shows the view from above of the substrate 102 at this stage of the method, another words comprising, in addition to elements of the devices 100 and first dicing lanes 130, the second dicing lanes 140 exposed in the resin layer 116.

In considering the overall pattern formed by the devices 100 and the first dicing lanes 130, the second dicing lanes 140 start from the corners forming salient angles of this pattern and run to the edges of the substrate 102, and are each aligned with a straight line passing through the centre of the substrate 102 and the corner from which this second dicing lane 140 extends. In the example of FIG. 7, the corners of the pattern formed by the devices 100 and the first dicing lanes 130 from which the second dicing lanes extend 140 correspond to those formed by the first dicing lanes 130 which surround only a single device 100.

The patterns exposed in the resin layer 116 during the two photolithography steps described above, namely the elements of the devices 100 other than those previously produced in the first active layer 108, the first dicing lanes 130 and the second dicing lanes 140, are then etched through the entire thickness of the second active layer 112. Some portions of the second dielectric layer 110 are also etched, which in particular makes it possible to release the mobile elements of the devices 100 intended to be formed in the second active layer 112.

The substrate 102 is then disposed on the stretch film 114. The stretch film 114 comprises an adhesive material, for example a polymer, enabling the holding of the substrate 102 thereon. Moreover, the adhesive material of the stretch film 114 in this case has the property of being sensitive to an exposure to UV rays such that the regions of the stretch film 114 exposed to these UV rays lose their adhesive property. This exposure to the UV rays will be implemented subsequently in order to detach the devices 100 produced.

Figure 8:
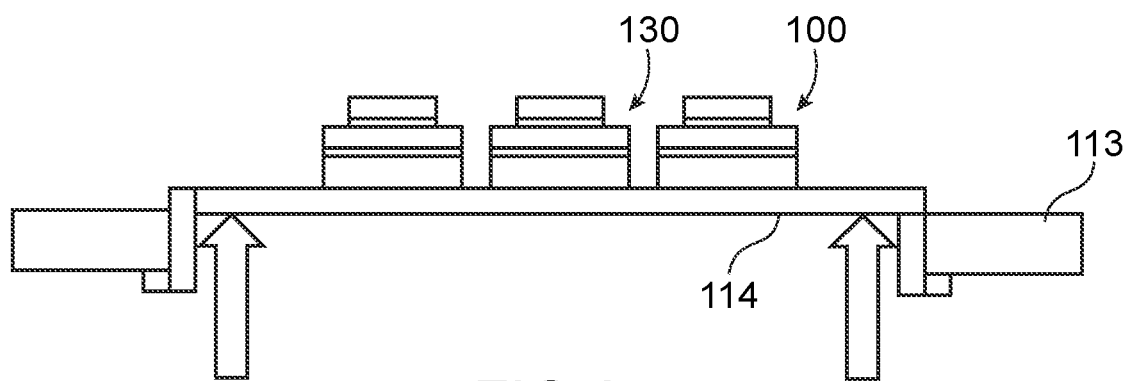

As can be seen in FIG. 8, the edges of the stretch film 114 are secured to a holding element 113, for example in the form of a ring, which serves for the isotropic stretching of the stretch film 114.

A step of irradiating the substrate 102 by a laser beam ("stealth dicing") is implemented through the first and second dicing lanes 130, 140, which makes it possible to form, in the support layer 104 and in the first active layer 106, lines of weakness under the first and second dicing lanes 130, 140. The laser beam used, locally modifies, at the focal point of the beam, the crystalline structure of the semiconductor of the support layer 104 and of the first active layer 106. The illuminated semiconductor becoming locally amorphous in a surrounding context of crystalline environment, a stress concentration appears at this location and relaxes by microcracking. Several passes of the laser beam are carried out, at different depths, in order to form the lines of weakness both in the support layer 104 and in the first active layer 106.

The stretch film 114 is then stretched in order to separate the devices 100 from each other at the first dicing lanes 130 and the lines of weakness being located under the first dicing lanes 130 (FIG. 8, in which only three devices 100 are shown). This operation is implemented, for example, by applying a force at the edges of the rear face of the film 114 (force symbolically represented by the arrows in FIG. 8), along the inner edges of the holding element 113, in other words along a circle of radius less than the radius of the circle formed by the inner edges of the holding element 113 and greater than the radius of the substrate 102. For example, it is possible to use an annular or tubular element and to move this element upwards, in other words in the direction corresponding to the arrows represented in FIG. 8, while keeping the other elements (holding element 113, film 114 and substrate 102) at the same height during this movement. Given that the rear face of the film 114, against which this element abuts, is not adhesive, the film 114 slides locally at the contact regions with this element which applies the force on this rear face of the film 114. Due to the fact that the edges of the film 114 are secured to the holding element 113 which is fixed, the force applied on the rear face of the film 114 enables an isotropic stretching of the substrate 102. The consequence of this stretching is that the different portions of the substrate 102 which each correspond to one of the devices 100 detach from each other.

The portions of the substrate 102 located at the edges and in which no device 100 is produced, also detach from each other at the second dicing lanes 140 and at the lines of weakness located under the second dicing lanes 140.

The devices 100 are then detached from the stretch film 114 preferably by having beforehand performed an exposure by UV radiation of the stretch film 114 from the rear face, in other words the face opposite that on which the devices 100 are located, in order to remove the adhesive properties of the film 114 with respect to the devices 100.

Figure 9:
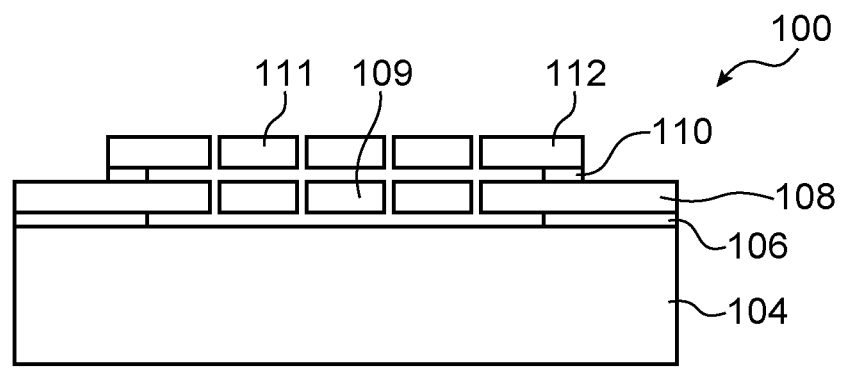

FIG. 9 schematically illustrates one of the devices 100 obtained at the end of this method. The elements of the device 100 produced in the second active layer 112 are visible in this figure, and carry reference sign 111.

In the particular embodiment described above, the patterns of the first dicing lanes 130 are included in the pattern of the reticle 118 also serving for the production of the elements 111 of the devices 100 intended to be produced in the second active layer 112. According to a variant, it is possible that the pattern of the first dicing lanes 130 does not form part of the pattern of the reticle 118 but forms part of the pattern of the etch mask 132 with which the second dicing lanes 140 are defined. This variant is possible due to the large width of the first dicing lanes 130, for example greater than approximately 100 µm, which makes possible their production from an etch mask intended to be exposed over the entire surface of the substrate 102. According to another variant, the patterns of the first dicing lanes 130 can be distributed in the pattern of the reticle 118 and in the pattern of the etch mask 132.

In the particular embodiment described above, the devices 100 comprise fixed and/or mobile elements distributed in two superimposed active layers 108, 112. In a variant, it is possible that the substrate 102 in which the devices 100 are produced comprises a single active layer in which all the elements of the devices 100 are formed. The first and second dicing lanes 130, 140 are therefore also produced in this single active layer, and the lines of weakness are only formed in the support layer 104. The method described above is very advantageous when this single active layer comprises, for example, the doped semiconductor having a large thickness, for example greater than or equal to approximately 120 µm.

Regardless of the number of layers which comprises the substrate 102, an advantageous variant of the method consists of using the etch mask 132 serving for the production of the second dicing lanes 140, in order to produce an identification of the devices 100, by including a separate identifier for each of the devices 100 in the etch mask 132. More specifically, such a separate identification of each of the devices 100 cannot be produced when only one "stepper" photolithography step is implemented in order to produce the devices 100 (due to the fact that the pattern of the reticle 118 is repeated a plurality of times in order to define all of the devices 100, which is not compatible with the association of a separate identifier for each of the devices 100). This identifier can correspond, for example, to a number specific to each of the devices 100.

In addition, in the above described method, the first dicing lanes 130 are produced in the form of straight lines forming rectangular frames surrounding the devices 100. In a variant, and due to the fact that these first dicing lanes 130 are produced by photolithography, it is possible that the first dicing lanes 130 do not form rectangles around the devices 100, but different shapes chosen depending on the shape of the chips that it is desired to obtain.

What is claimed is:

1. A method for producing semiconductor devices in a substrate, comprising at least the implementation of the following steps:

photolithography of a pattern of a reticle over a portion of a main face of the substrate, defining at least first elements of at least one of the semiconductor devices in the substrate, an exposure of the pattern of the reticle being repeated a plurality of times over the main face of the substrate in order to define said at least first elements of all the semiconductor devices, photolithography of a pattern of an etch mask over all of the main face of the substrate, etching of the photolithography patterns over the main face of the substrate into one portion of a thickness of the substrate, wherein first dicing lanes encircling the semiconductor devices are included in the pattern of the etch mask and/or in the pattern of the reticle, and the step of photolithography of the pattern of the etch mask over all of the main face of the substrate defines second dicing lanes defined by predetermined fracture lines of the edges of the substrate, and further comprising the implementation of a step of irradiating the substrate with a laser beam through the first and second dicing lanes, forming lines of weakness in the substrate, under the first and second dicing lanes.

2. The method according to claim 1, wherein:
the substrate comprises a support layer, a first active semiconductor layer, and a first dielectric layer disposed between the support layer and the first active layer,
said at least first elements of the semiconductor devices and the first and second dicing lanes are etched in the first active layer, and
the lines of weakness are formed in the support layer.

3. The method according to claim 2, wherein a thickness of the first active layer is greater than or equal to approximately 120 μm.

4. The method according to claim 1, wherein:
the substrate comprises a support layer, a first active semiconductor layer, a first dielectric layer disposed between the support layer and the first active layer, a second dielectric layer such that the first active layer is disposed between the first and second dielectric layers, and a second active semiconductor layer such that the second dielectric layer is disposed between the first and second active layers,
said at least first elements of the semiconductor devices and the first and second dicing lanes are etched at least in the second active layer, and
the lines of weakness are formed in the support layer and in the first active layer.

5. The method according to claim 4, further comprising, before implementing the photolithography steps, the implementation of the following steps:
producing, from a stack comprising the support layer, the first dielectric layer and the first active layer, second elements of the semiconductor devices in the first active layer by photolithography and etching,
transferring and securing the second dielectric layer and the second active layer against a first active layer.

6. The method according to claim 4, wherein a total thickness of the first and second active layers is greater than or equal to approximately 120 μm.

7. The method according to claim 1, wherein:
between the steps of etching the photolithography patterns and the step of irradiating the substrate with a laser beam, the substrate is disposed on a stretch film, and
after implementing the step of irradiating the substrate, the stretch film is stretched so that the semiconductor devices are separated from each other at the first dicing lanes and so that different portions of the substrate forming the edges of the substrate are separated from each other at the second dicing lanes.

8. The method according to claim 7, wherein the stretch film is stretched isotropically.

9. The method according to claim 1, further comprising, before implementing the photolithography steps, a step of identifying the predetermined fracture lines of the edges of the substrate by modelling or by analytic calculation or by observation of fracture lines obtained in another substrate identical to said substrate and in which the second dicing lanes have not been produced.

10. The method according to claim 1, wherein the second dicing lanes are located at least on the predetermined fracture lines of the edges of the substrate.

11. The method according to claim 1, wherein the predetermined fracture lines of the edges of the substrate extend from the corners formed by the first dicing lanes to the edges of the substrate.

12. The method according to claim 1, wherein the semiconductor devices are MEMS and/or NEMS semiconductor devices.

13. The method according to claim 1, wherein the pattern of the etch mask includes a separate identifier for each of the semiconductor devices.

14. The method according to claim 1, wherein the pattern of the etch mask includes a portion of the patterns of the semiconductor devices.

15. The method according to claim 7, wherein the stretch film comprises a polymer and has adhesive properties, and wherein, after stretching of the stretch film, the stretch film is exposed to UV radiation from a face opposite that on which the semiconductor devices are located.

16. The method according to claim 1, wherein the first dicing lanes form frames of substantially rectangular shape around the semiconductor devices.

* * * * *